United States Patent
Jin et al.

(10) Patent No.: US 10,236,824 B2
(45) Date of Patent: Mar. 19, 2019

(54) ULTRA-LOW POWER VOLTAGE CONTROLLED OSCILLATOR

(71) Applicant: Taiwan Semiconductor Manufacturing Co., Ltd., Hsin-Chu (TW)

(72) Inventors: Jun-De Jin, Hsinchu (TW); Ying-Ta Lu, Hsinchu (TW); Hsien-Yuan Liao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 119 days.

(21) Appl. No.: 15/297,580

(22) Filed: Oct. 19, 2016

(65) Prior Publication Data

US 2018/0109225 A1 Apr. 19, 2018

(51) Int. Cl.
  *H03B 5/04* (2006.01)
  *H03B 5/12* (2006.01)

(52) U.S. Cl.
  CPC ............ *H03B 5/1212* (2013.01); *H03B 5/04* (2013.01); *H03B 5/124* (2013.01); *H03B 5/1215* (2013.01); *H03B 5/1228* (2013.01); *H03B 5/1243* (2013.01); *H03B 5/1296* (2013.01)

(58) Field of Classification Search
  CPC .. H03B 5/1228; H03B 5/1215; H03B 5/1243; H03B 5/1212; H03B 5/1253; H03B 5/1265; H03B 5/04; H03B 5/124; H03B 5/1293; H03B 5/1296; H03B 2200/0038; H03B 2200/005; H03B 2200/0074; H03B 2200/0082; H03B 2200/0098; H03B 2200/009; H03B 2201/025; H03B 27/00; H03B 5/06; H03B 5/1203; H03B 5/1262; H03B 5/1218; H03B 5/127
  USPC .................................. 331/167, 117 FE, 179
  See application file for complete search history.

(56) References Cited

U.S. PATENT DOCUMENTS

| | | | |
|---|---|---|---|
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,912,581 B2 | 12/2014 | Lin et al. | |
| 8,941,212 B2 | 1/2015 | Yen et al. | |
| 9,184,256 B2 | 11/2015 | Huang et al. | |
| 9,209,521 B2 | 12/2015 | Hung et al. | |
| 9,397,613 B2 * | 7/2016 | Babaie | H03B 5/1215 |
| 2009/0208226 A1 * | 8/2009 | Gao | H03L 7/089 398/202 |
| 2014/0132333 A1 | 5/2014 | Jin et al. | |
| 2014/0253262 A1 | 9/2014 | Hsieh et al. | |

(Continued)

*Primary Examiner* — Arnold Kinkead
(74) *Attorney, Agent, or Firm* — Duane Morris LLP

(57) ABSTRACT

A voltage controlled oscillator ("VCO") circuit is disclosed. The VCO includes a switch module comprising a first transistor and a second transistor; a first LC-tank module, the first LC-tank module is operatively connected between the drain of the first transistor and the drain of the second transistor; and a second LC-tank module, the second LC-tank module is operatively connected between the gate of the first transistor and the gate of the second transistor, the source of the first transistor and the source of the second transistor are operatively connected.

20 Claims, 9 Drawing Sheets

(56) References Cited

U.S. PATENT DOCUMENTS

2014/0253391 A1    9/2014  Yen
2015/0364417 A1   12/2015  Lee

* cited by examiner

ULTRA-LOW POWER VOLTAGE CONTROLLED OSCILLATOR

BACKGROUND

The "Internet of Things" (IoT) is envisioned to be a network of physical devices, vehicles, buildings and other items—embedded with sensors, electronics, software, actuators, etc. to enable network connectivity that will allow these objects to collect and exchange information. The IoT allows objects to be sensed and controlled remotely across existing network infrastructure, creating opportunities for more direct integration of the physical world into computer-based information systems, and resulting in improved efficiency, accuracy and economic benefit.

A "voltage controlled oscillator" (VCO) is an electronic oscillator whose oscillation frequency is controlled by an input voltage. The applied input voltage determines the instantaneous oscillation frequency. As a result, modulating signals applied to control the input may cause frequency modulation or phase modulation. Conventional VCO designs suffer from a plurality of issues, which include the following: 1. the gate DC voltage cannot be adjusted; 2. there is no negative Miller capacitor; and 3. there is no transformer feedback. For VCO designs that implement transformer feedback with a one-side resonator, in addition to lacking a negative Miller capacitor, the quality of the resonator is not optimized. For VCO designs with a start-up circuit, in addition to lacking a negative Miller capacitor, no transformer feedback is implemented.

An ultra-low power VCO is typically implemented in wireless sensor nodes, and also typically utilized in energy harvesting implementations such as thermo-electric generators. Ultra-low power and ultra-low voltage VCO's are typically achieved by the following implementations: subthreshold design on gate terminal, near-triode design on drain terminal, transformer feedback, two-side resonators, and a negative Miller capacitor. Some examples of implementations include, but are not limited to cellular applications, Wi-Fi, Bluetooth low energy applications and Zigbee (IEEE 802.15.4).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
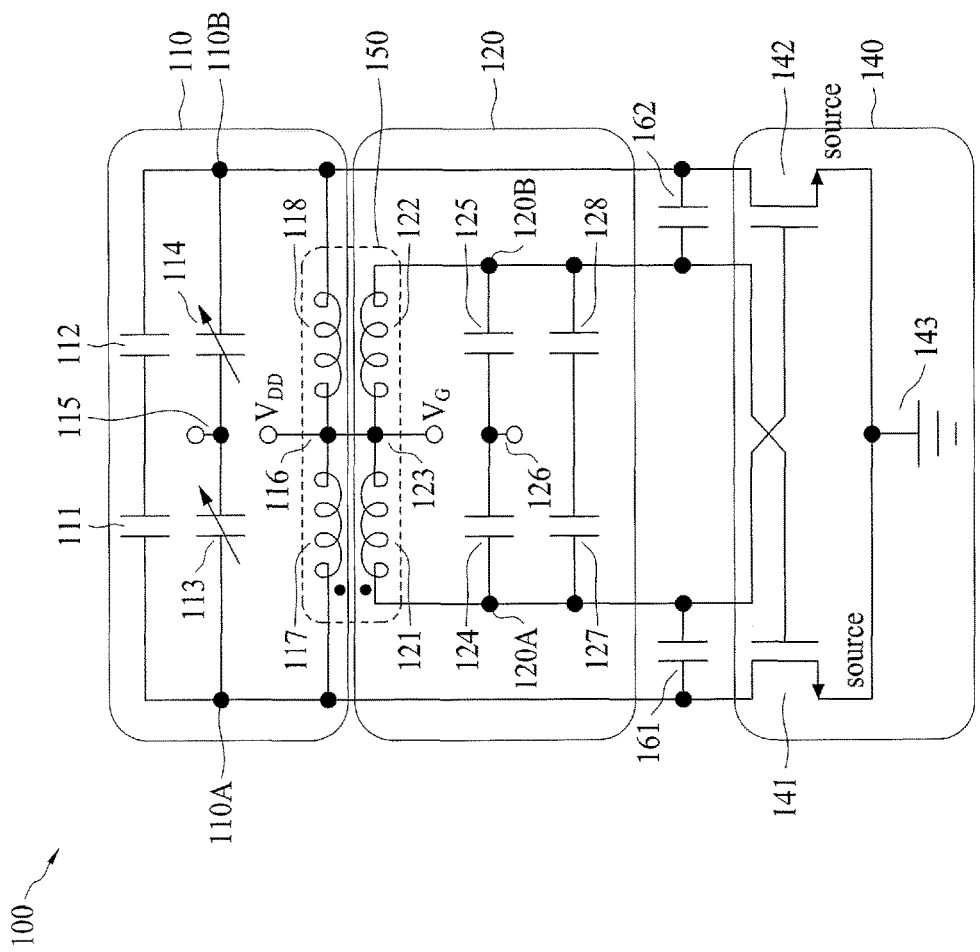
FIG. 1A is a schematic illustration of a circuit design of a ultralow power VCO, in accordance with some embodiments.

The following disclosure provides various embodiments, or examples, for implementing various features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a schematic illustration of a circuit design of a ultralow power VCO, in accordance with some embodiments. According to some embodiments, a VCO circuit 100 includes a first LC-tank module 110, a second LC-tank module 120, two Miller capacitors 161, 162, and an NMOS switch module 140. According to some embodiments, the first LC-tank module 110 includes a plurality of capacitors, a plurality of varactors and a plurality of inductors. According to some embodiments, the capacitors, varactors and inductors are not discrete devices but integrated on an integrated circuit (IC) chip. According to some embodiments, the first LC-tank module 110 includes two capacitors, two varactors and two inductors. The first capacitor 111 and the second capacitor 112 in the first LC-tank module 110 are electrically connected in serial. Similarly, first varactor 113 and the second varactor 114 are electrically connected in serial, and the first inductor 117 and the second inductor 118 are electrically connected in serial. The node between the first varactor 113 and the second varactor 114 is node 115. The node between the first inductor 117 and the second inductor 118 is node 116, or $V_{DD}$. The serially connected capacitor pairs 111, 112, the serially connected varactor pairs 113, 114, and the serially connected inductor pairs 117, 118 are connected in parallel to form two nodes of the first LC-tank module: a first node 110A and a second node 110B.

According to some embodiments, the second LC-tank module 120 has a structure that is similar to the first LC-tank module. According to some embodiments, the second LC-tank module 120 includes a plurality of capacitors, a plurality of varactors and a plurality of inductors. According to some embodiments, the capacitors, varactors and inductors are not discrete devices but, rather, integrated on an IC chip. According to some embodiments, the second LC-tank module 120 includes two capacitors 127, 128, two varactors 124, 125 and two inductors 121, 122. The corresponding capacitors 127, 128 are electrically connected in serial, the corresponding varactors 124, 125 are connected in serial, and the inductors 121, 122 are connected in serial. And then, similar to the first LC-tank module, these capacitors, varactors and inductors are connected in parallel to form two nodes of the second LC-tank module 120: a first node 120A and a second node 120B. The node between the first varactor 124 and the second varactor 125 is node 126, the node between the first inductor 121 and the second inductor 122 is node 123, or $V_G$.

According to some embodiments, the inductors 117, 118 in the first LC-tank module 110 are coupled with the inductors 121, 122 in the second LC-tank module 120 to form a transformer 150. According to some embodiments, metal cores are implemented in the transformer 150 to improve the quality of the inductors and the mutual inductance. As a result, the first LC-tank 110 and the second LC-tank 120 are coupled together through the transformer 150, which provides feedback to the entire circuit 100. According to some embodiments, transformer feedback improves the quality of the inductors.

According to some embodiments, the NMOS switch module 140 includes two NMOS transistors: a first NMOS 141 and a second NMOS 142. A first Miller capacitor 161 operatively connects the first node 110A of the first LC-tank module 110 and the first node 120A of the second LC-tank module 120. Similarly, a second Miller capacitor 162 operatively connects the second node 110B of the first LC-tank module 110 and the second node 120B of the second LC-tank module 120. The first node 110A of the first LC-tank module 110 also connects to the drain of the first NMOS transistor 141, similarly, the second node 110B of the first LC-tank module 110 also connects to the drain of the second NMOS transistor 142. The first node 120A of the second LC-tank module connects to the gate of the second NMOS 142; similarly, the second node 120B of the second LC-tank module 120 connects to the gate of the first NMOS 141. The sources of the first and the second NMOS transistors are connected together and grounded.

According to some embodiments, both NMOS transistors 141, 142 are implemented with resonators connected to two sides, respectively, to achieve better quality (Q) for the resonators. For example, the drain side the NMOS transistor 141 is electrically connected to the first LC-tank module 110, while gate side of the NMOS transistor 141 is connected to the second LC-tank module 120. Similarly for the second NMOS transistor 142, both the drain and gate sides are connected to the first and second LC-tank modules, respectively. According to some embodiments, the implementation of Miller capacitors 161 and 162 improves the speed of the transistors and the VCO circuit.

In electronics, the Miller effect accounts for the increase in the equivalent input capacitance of an inverting voltage amplifier due to amplification of the effect of capacitance between the input and output terminals. The virtually increased input capacitance due to the Miller effect is given by $C_M = C(1+A_v)$, where $A_v$ is the gain of the amplifier and C is the feedback capacitance. Although the term Miller effect normally refers to capacitance, any impedance connected between the input and another node exhibiting gain can modify the amplifier input impedance via this effect. These properties of the Miller effect are generalized in the Miller theorem. The Miller capacitance due to parasitic capacitance between the output and input of active devices like transistors and vacuum tubes is a major factor limiting their gain at high frequencies.

According to some embodiments, in the implementation of FIG. 1A, the gate biasing of the NMOS transistors is a sub-threshold biasing, while the drain biasing of the NMOS transistors is a near triode biasing, as discussed in further detail below. MOSFET transistors are generally used as switching devices in digital circuits with close to zero current and very large turn on current. In static CMOS topology, the steady state current of a logic gate is very small. In analog applications MOSFET devices are employed as active devices generally biased in strong inversion to be able to operate at high frequencies and at the same time keep the noise level very low. On the other hand, sub-threshold MOSFET devices are suitable for ultra-low power applications where the device current density is very low. Triode bias is a DC voltage applied to a triode, bias point in low power applications that is set to minimize distortion and achieve sufficiently low power draw.

According to some embodiments, a thicker metal core of the transformer improves the quality of the inductors. For example, 2Z+AP and 2U+AP are two implementations, where Z metal has a thickness of 1 μm and U metal has a thickness of 3 μm, and AP stands for aluminum pad. According to some embodiments, 2U+AP provides better quality because the 2U+AP provides a thicker metal core.

As described above, in accordance with some embodiments, an ultralow power VCO is provided that achieves better inductor quality through the implementation of transformer feedback and two-side resonators. In addition, higher speed is achieved through the implementation of negative Miller capacitors.

Figure 1B:
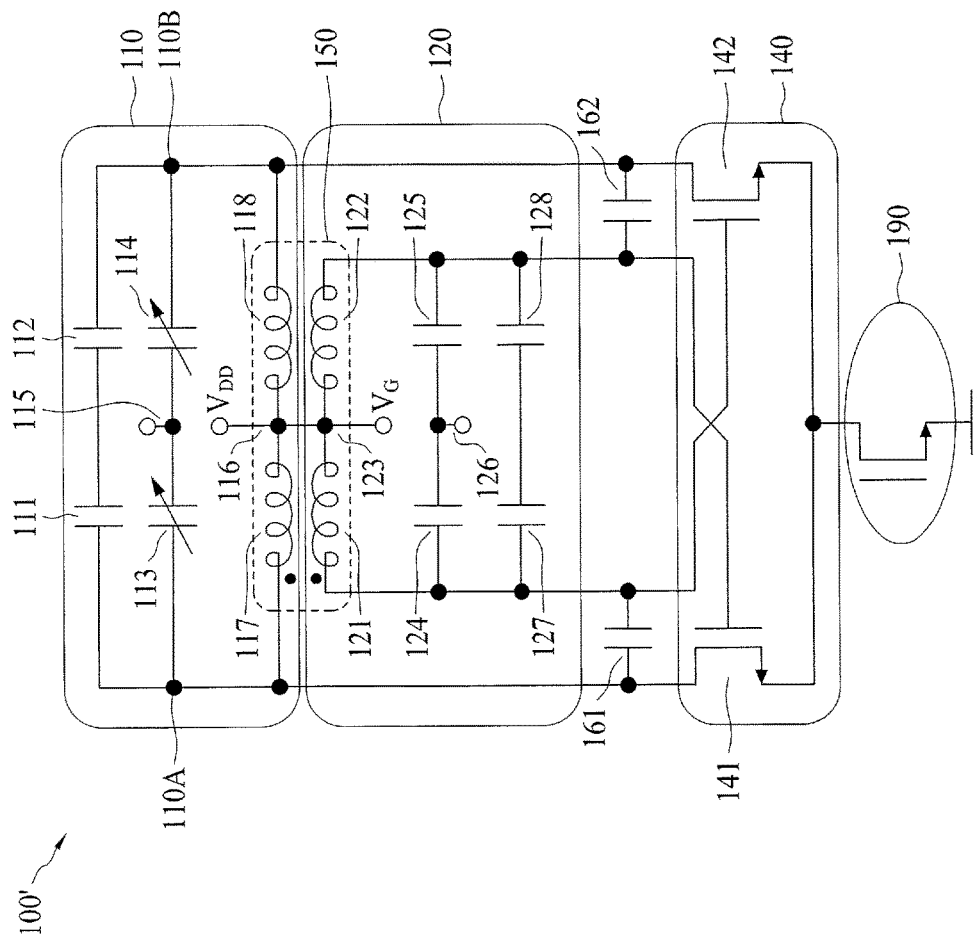
FIG. 1B is a schematic illustration of an alternative circuit design of a ultralow power VCO, in accordance with some embodiments.

FIG. 1B is a schematic illustration of an alternative circuit design of a ultralow power VCO 100', in accordance with some embodiments. According to some embodiments, the VCO circuit 100' is built upon the VCO 100 in FIG. 1A by adding a tail transistor 190 between the sources of the first and the second NMOS transistors in the NMOS switch module 140 and the ground. The drain of the tail NMOS transistor 190 is connected to the sources of the first 141 and the second 142 NMOS transistors in the NMOS switch module 140. The source of the tail NMOS transistor 190 is grounded. The tail NMOS transistor 190 is implemented as a tail current source to provide tail current.

Figure 2:
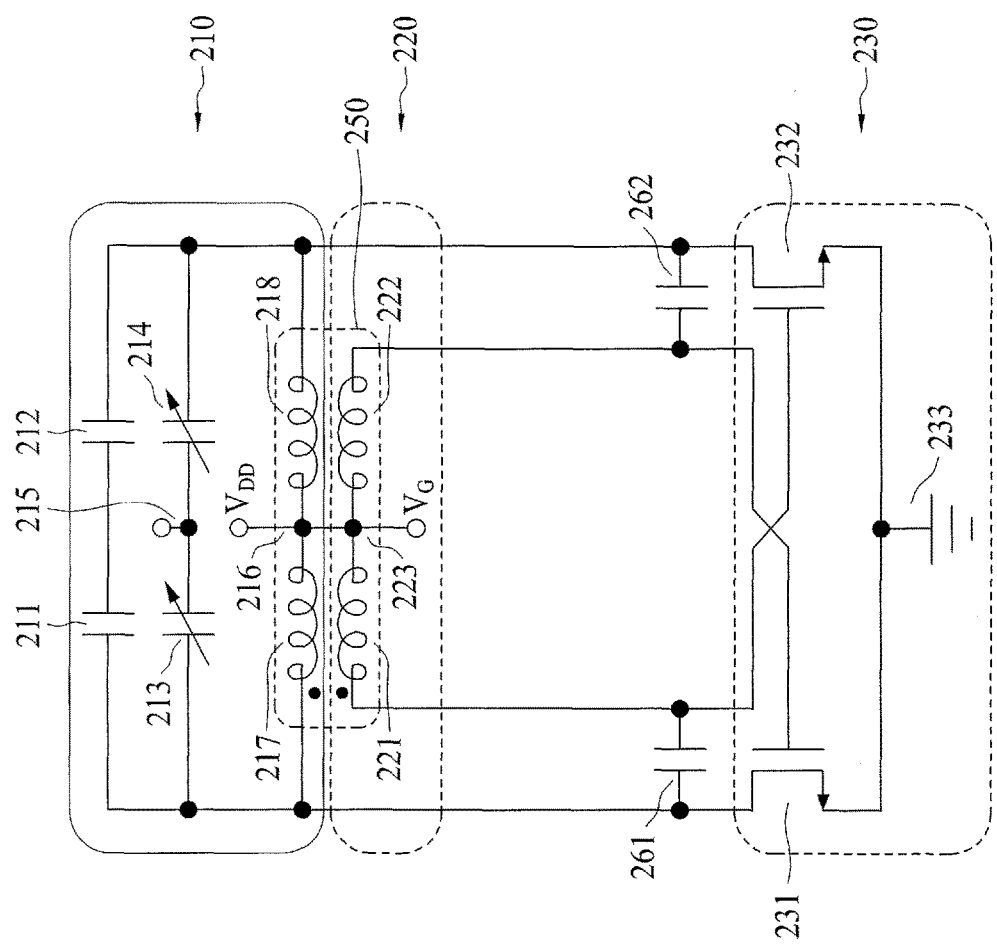
FIG. 2 is a schematic illustration of another circuit design of a ultralow power VCO, in accordance with some embodiments.

FIG. 2 is a schematic illustration of another circuit design of a ultralow power VCO, in accordance with some embodiments. According to some embodiments, the circuit design in FIG. 2 includes several modules which are similar to the modules in FIG. 1A, the LC-tank module 210 is similar to the LC-tank module 110, the switch module 230 is similar to the switch module 140, and there are two Miller capacitors 261 and 262 similar to the Miller capacitors 161 and 162. The module 220 is different from LC-tank module 120 in that the module 220 includes only inductors. As discussed above, according to some embodiments, the LC-tank module 120 may include a plurality of inductors. According to some embodiments, there are two inductors. According to some embodiments, these inductors are not discrete devices (e.g., they are integrated on an IC chip). Similar to the discussion above, the inductors in the module 220 are coupled to the inductors in the LC-tank module 210 to form a transformer 250, which provide feedback. In the present implementation in FIG. 2, the LC-tank module 210 is located between the drains of the transistor 231 and 232 in the switch module 230. According to some embodiments, the resonator in the present implementation is located on the drain-side. According to some embodiments, the parasitic capacitance on the drain side together with the drain side inductance form the equivalence of another resonator, accordingly, the implementation in FIG. 2 is still a two-side resonator and thus provides the benefits of a two-side resonator. According to some embodiments, a gate-side resonator implementation is discussed below in FIG. 3, in which, instead of being located between the drains of the transistors in the switch module, the resonator, or the LC-tank is located between the gates of the transistors in the switch module.

Figure 3:
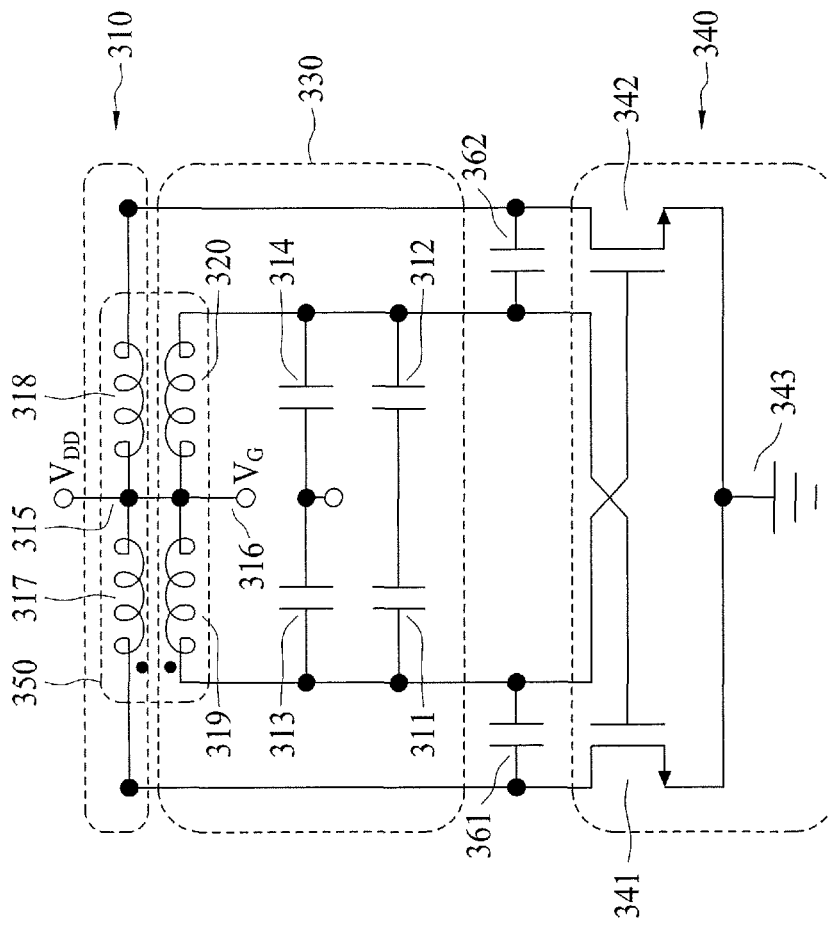
FIG. 3 is a schematic illustration of yet another circuit design of a ultralow power VCO, in accordance with some embodiments.

FIG. 3 is a schematic illustration of yet another circuit design of a ultralow power VCO, in accordance with some embodiments. According to some embodiments, in comparison to the implementation discussed above in FIG. 2, in which the resonator 210 is located between the drains of the transistors, the resonator 330, or the LC-tank module 330, in this implementation is located between the gates of the transistors in the switch module 340. Other modules are similarly situated as corresponding modules in FIG. 2. And similarly, a transformer 350 is formed by coupling the inductors in the module 310 and 330. As discussed above, in comparison to the drain-side resonator implementation in FIG. 2, the resonator in the present implementation is located on the gate-side. According to some embodiments, the parasitic capacitance on the gate side together with gate side inductance form the equivalence of another resonator, accordingly, the implementation in FIG. 3 is still a two-side resonator and thus provides the benefits of a two-side resonator.

Figure 4:
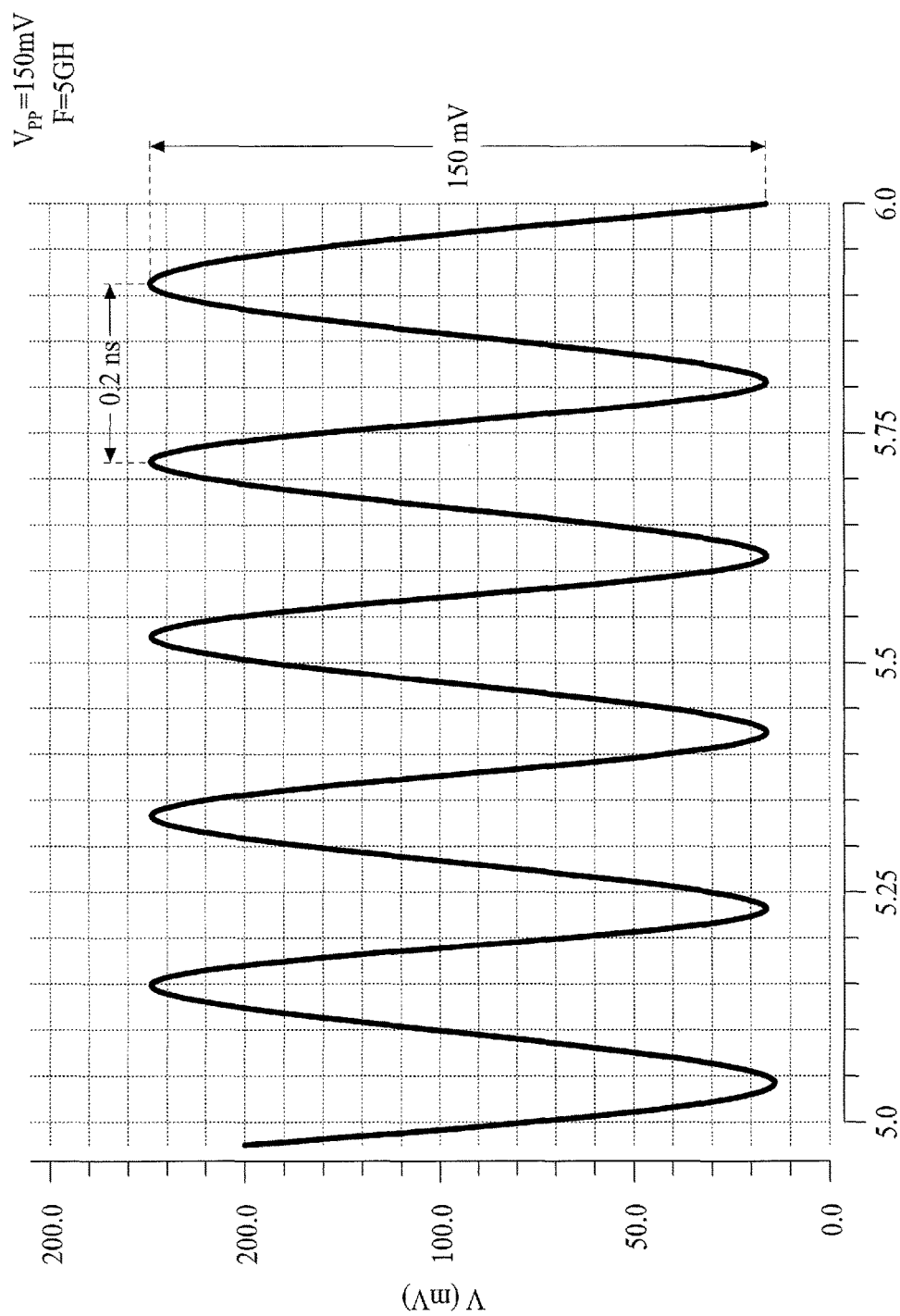
FIG. 4 is a curve illustrating the relationship between time and drain-ground voltage implementing the circuit design in FIG. 1A, in accordance with some embodiments.

FIG. 4 is a curve illustrating the relationship between time and drain-ground voltage implementing the circuit design in FIG. 1A, in accordance with some embodiments. According to some embodiments, the drain-ground voltage signal for the first NMOS transistor 141 is observed between the node 110A and the ground node 143. For NMOS transistor 142, similarly, the drain-ground voltage signal is observed between the node 110B and the ground node 143. The drain ground voltage signals of the NMOS transistors 141 and 142 have the same peak to peak amplitude but with a 180 degree phase difference. The horizontal axis is time in nano-second and the vertical axis if voltage in mV. As can be seen in FIG. 4, the period is 0.2 ns, which produces a frequency of 5 GHz, and the peak-to-peak amplitude is 150 mV.

According to some embodiments, the frequency is changed to produce a plurality of data pairs (frequency, voltage), then produce data pairs (frequency, FoM) by implementing the following figure of merit (FoM) formula:

$$FoM_{VCO} = \left(\frac{f_0}{\Delta f}\right)^2 \frac{1}{L\{\Delta f\}P},$$

where $\Delta f$ is the offset frequency, L is the phase noise, and P is the DC power.

Figure 5:
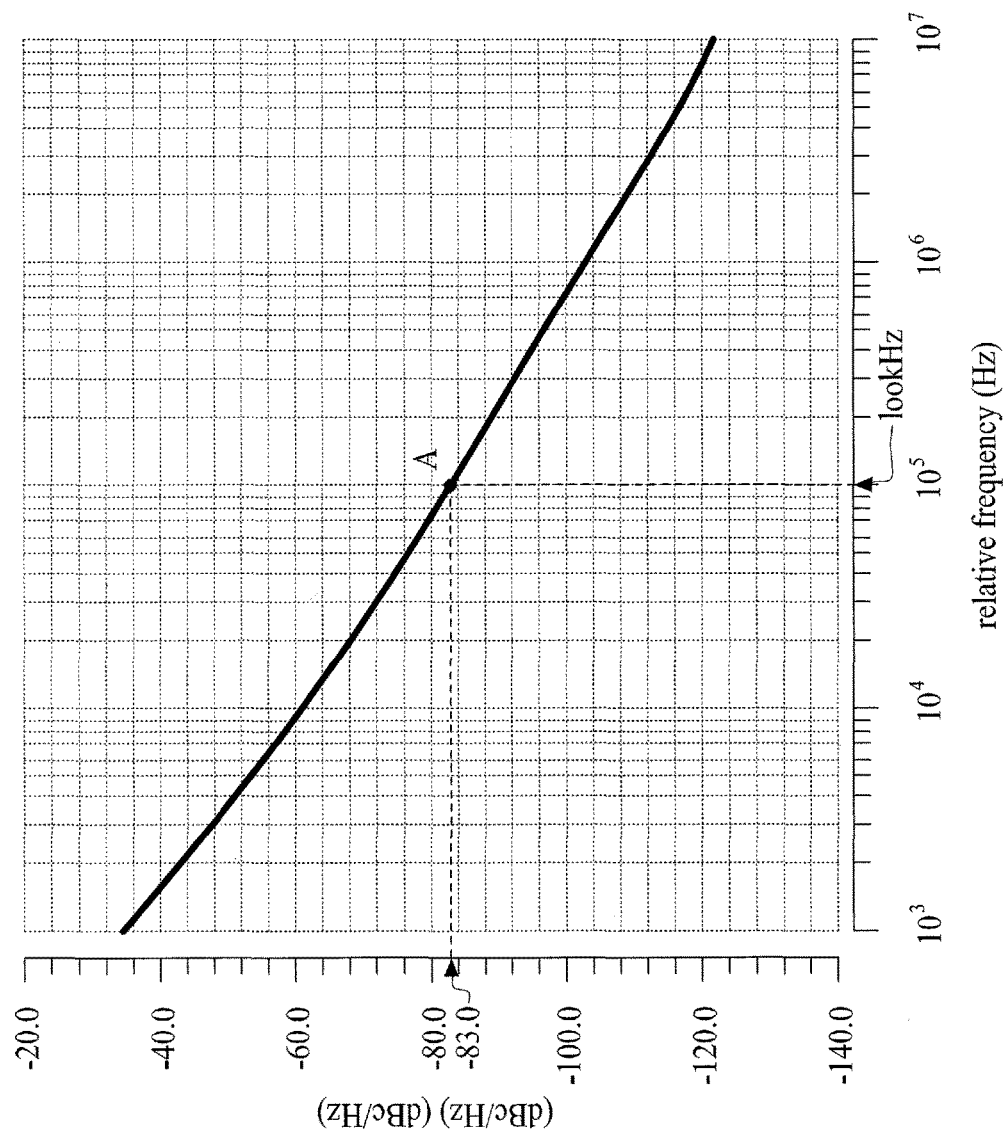
FIG. 5 is a curve illustrating the relationship between relative frequency and FoM implementing the circuit design in FIG. 1A, in accordance with some embodiments.

FIG. 5 is a curve illustrating the relationship between relative frequency and FoM implementing the VCO circuit design in FIG. 1A, in accordance with some embodiments. As discussed in FIG. 4 above, the relationship between frequency and FoM is obtained and plotted, which represent the phase noise between the drain and ground of the NMOS transistors in the NMOS switch module. The data point A in the plot corresponds to phase noise at 100 KHz offset frequency, which is −83 dBc/Hz. This data point A can also be found in Table 1 below, when the $V_{DD}$ is 100 mV, $P_{DC}$ is 21 μW, Freq is 5 GHz, phase noise is 83 dBc/Hz.

In Table 1 below, a comparison of two scenarios of the present implementations with five existing benchmarks are shown. The present implementation includes two scenarios, the first one is when $V_{DD}$ is 100 mV, while the second one is when $V_{DD}$ is 190 mV. Corresponding DC power, frequency, phase noise, FoM, core area and CMOS technology are shown below 100 mV and 190 mV respectively. The five existing benchmarks include: 2009 VLSI, 2014 ESSCIRC, 2009 VLSI(at a different voltage), 2015 JSSC, and 2015 CICO. The data shown in Table 1 demonstrates significant improvement in performance using the implementation of FIG. 1A, in accordance with some embodiments.

|  | Present Implementation | | 2009 VLSI | 2014 ESSCIRC | 2009 VLSI | 2015 JSSC | 2015 CICC |
|---|---|---|---|---|---|---|---|
| $V_{DD}$ (mV) | 100 | 190 | 200 | 225 | 300 | 350 | 600 |
| $P_{DC}$ (μW) | 21 | 24 | 114 | 171 | 159 | 1,300 | 72 |
| Frequency (GHz) | 5 | 5 | 4.5 | 2.35 | 4.5 | 5.05 | 2.4 |
| Phase noise (dBc/Hz) | 83 | 89 | 79 | 90 | 84 | 88 | 105 |
| FoM (dBc/Hz) | 194 | 199 | 181 | 185 | 185 | 181 | 204 |
| Core Area (mm²) | 0.06 | | 0.29 | 0.17 | 0.29 | 0.17 | 0.08 |

Figure 6:
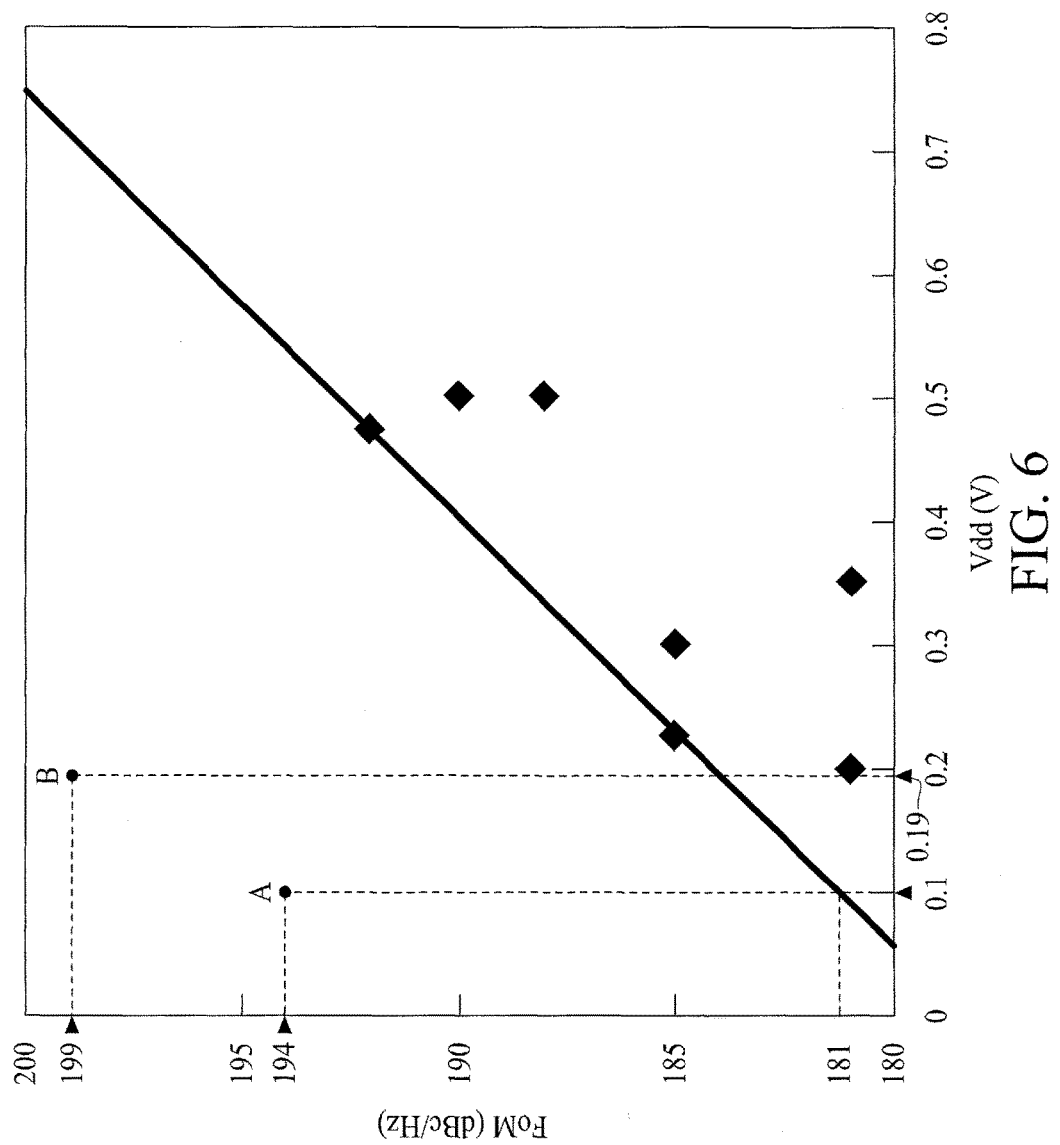
FIG. 6 is a comparison of the performance of the present implementations with existing benchmarks, in accordance with some embodiments.

FIG. 6 is a comparison of the performance of the present implementations with existing benchmarks, in accordance with some embodiments. The benchmark values in Table 1 are plotted in FIG. 6 as diamond dots, and the performance of the present implementation in Table 1 are plotted as round dots. The rounds dots represent performance values of: $V_{DD}$=100 mV, FoM=194 dBc/Hz, for dot A; and $V_{DD}$=190 mV, FoM=199 dBc/Hz, for dot B, as are shown in the first two columns of Table 1. According to the linear regression trend line in the figure, existing technology is expected to produce FoM of 181 dBc/Hz at 100 mV. According to some embodiments, by using 16 nm technology of the present implementation, FoM=194 dBc/Hz is achieved when $V_{DD}$=100 mV as shown by dot A, FoM=199 dBc/Hz is achieved when $V_{DD}$=190 mV as shown by dot B. As also can be seen in Table 1, a small core area as low as 0.06 mm² is achieved. According to some embodiments, with the implementation of ultra-thick metal, FoM values of more than 200 can be achieved.

Figure 7:
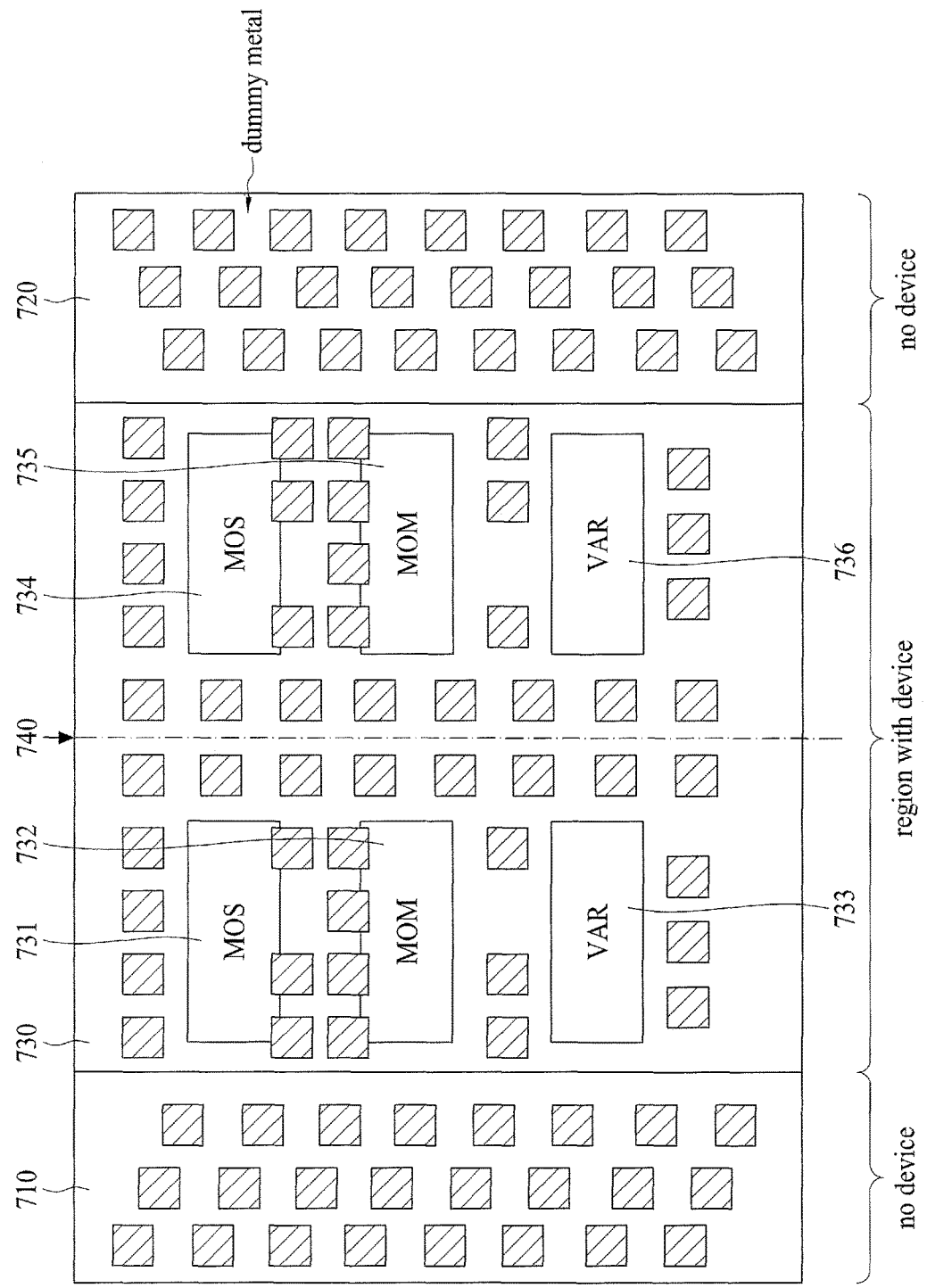
FIG. 7 is a schematic illustration of the symmetric layout design, in accordance with some embodiments.

FIG. 7 is a schematic illustration of the symmetric cell layout design of a VCO, in accordance with some embodiments. According to some embodiments, the cell layout of a VCO is designed symmetrically to achieve better performance. Regions 710 and 720 are regions without active devices, where only dummy metals are placed. For example, dummy metals are illustrated as squares with diagonal hash marks. In comparison, the region 730 includes a plurality of active devices and a plurality of dummy metals. The line 740 is the line of symmetry located in the geometric center of the region 730. According to some embodiments, the MOS devices 731 and 734, the MOS devices 723 and 725, and the VAR devices 733 and 736 are laid out on the substrate symmetrically relative to the line of symmetry 740. In addition, the dummy metals illustrated as hash-marked squares are also laid out symmetrically relative to the line of symmetry 740. In order to improve the overall performance and quality, and to minimize mismatch, the dummy metals on the regions 710 and 720, which do not include active devices, are also laid out symmetrically relative to the line of symmetry 740.

Figure 8:
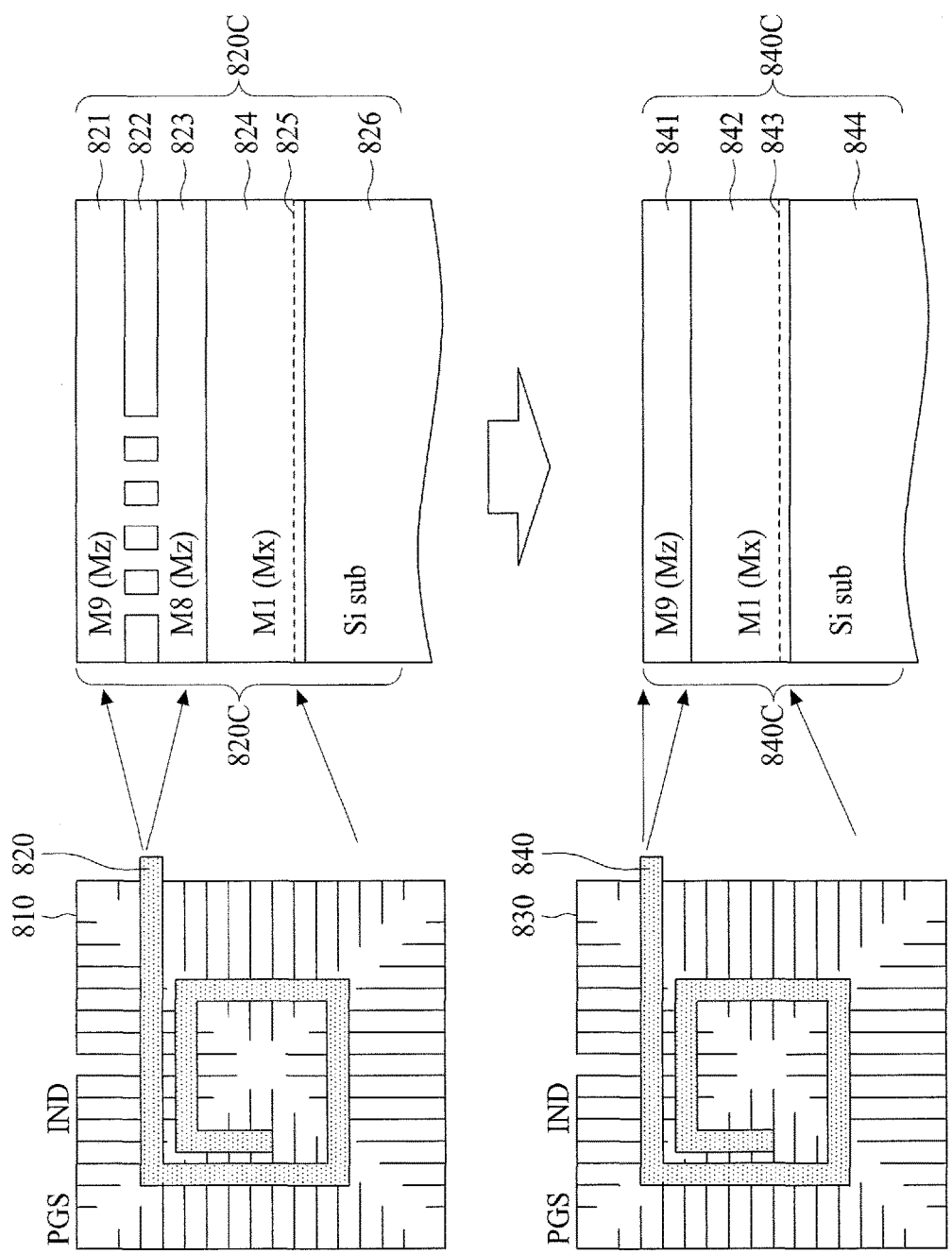
FIG. 8 is a schematic illustration of an inductor layout design, in accordance with some embodiments.

FIG. 8 is a schematic illustration of an inductor layout design in an integrated circuit, in accordance with some embodiments. According to some embodiments, the inductors of the implementations discussed above are designed as the following to improve quality of the inductors, and to further improve the performance of the VCO. According to some embodiments, an inductor 820 is laid on the top of a patterned ground share (PGS) 810, as shown in FIG. 8. The cross-sectional view of the inductor 820 is shown as 820C, which includes a plurality of layers. A silicon substrate layer 826 is provided as a bottom layer, then a dielectric layer 824 is formed on top of the substrate layer 826. Within the dielectric layer 824, the PGS layer 825, which is also designated as M1, is embedded. PGS 810 is a top view of the PGS layer 825. M8 layer 823 is on the top of the dielectric layer 824, and on the top of the M8 layer, there is another dielectric layer 822 followed by another M9 layer 821. M8 and M9 layers are generally any layers.

According to some embodiments, the M8 layer is removed to improve performance. The cross-sectional view 840C of the inductor 840 includes four layers: the silicon substrate layer 844, the dielectric layer 842, the PGS layer 843 designated as the M1 layer, and the M9 layer 841. According to some embodiments, the thickness of the thick metal layer is 0.5 μm~5 μm. According to some embodiments, the vertical distance between the PGS layer and the inductor is 0.5 μm~5 μm.

According to some embodiments, a VCO circuit is disclosed. The VCO includes a switch module comprising a first transistor and a second transistor; a first LC-tank module, the first LC-tank module is operatively connected between the drain of the first transistor and the drain of the second transistor; and a second LC-tank module, the second LC-tank module is operatively connected between the gate of the first transistor and the gate of the second transistor, the source of the first transistor and the source of the second transistor are operatively connected.

According to some embodiments, a VCO circuit is disclosed. The VCO includes a switch module, the switch module comprises a first transistor and a second transistor; a first LC-tank module with a first plurality of serially connected inductors; a second LC-tank module with a second plurality of serially connected inductors, wherein the first LC-tank module is connected between the drain of the first transistor and the drain of the second transistor, and the second LC-tank module is connected between the gate of the first transistor and the gate of the second transistor; and a first Miller device and a second Miller device, wherein the first Miller device is connected between the drain of the first transistor and the gate of the second transistor, and the second Miller device is connected between the drain of the second transistor and the gate of the first transistor; the source of the first transistor and the source of the second transistor are operatively connected.

According to some embodiments, a VCO circuit is disclosed. The VCO includes a first LC-tank module, the first LC-tank module comprises a first plurality of capacitors, a first plurality of varactors and a first plurality of inductors; a second LC-tank module, wherein the second LC-tank module comprises a second plurality of capacitors, a second plurality of varactors and a second plurality of inductors; a switch module, wherein the switch module comprises a plurality of transistors, and the switch module is operatively connected to the first LC-tank module and the second LC-tank module; and two Miller devices, wherein each of the Miller device is operatively connected to the first LC-tank module, the second LC-tank module, and the switch module, the first plurality of inductors is coupled to the second plurality of inductors to form a transformer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage controlled oscillator ("VCO") circuit, comprising:
    a switch module comprising a first transistor and a second transistor;
    a first LC-tank module, wherein the first LC-tank module is operatively connected between the drain of the first transistor and the drain of the second transistor;
    a second LC-tank module, wherein the second LC-tank module is operatively connected between the gate of the first transistor and the gate of the second transistor, wherein the source of the first transistor and the source of the second transistor are operatively connected;
    a first Miller device operatively connected between the first LC-tank module and the second LC-tank module: and
    a second Miller device operatively connected between the first LC-tank module and the second LC-tank module.

2. The VCO circuit of claim 1, wherein the first LC-tank module includes a first inductor circuit and the second LC-tank module includes a second inductor circuit, and wherein the first and second inductor circuits are coupled to thereby form a transformer.

3. The VCO circuit of claim 2, wherein the transformer is connected between the first transistor and the second transistor to provide feedback between the gates and the drains of the first transistor and the second transistor.

4. The VCO circuit of claim 1, wherein at least one of the first transistor and the second transistor is an NMOS transistor.

5. The VCO circuit of claim 1, wherein the sources of the first transistor and the second transistor are operatively connected to a current source.

6. The VCO circuit of claim 1, wherein the sources of the first transistor and the second transistor are grounded.

7. The VCO circuit of claim 1, wherein the sources of the first transistor and the second transistor are connected to the drain of a tail transistor.

8. The VCO circuit of claim 1, wherein the first Miller device is operatively connected between the drain of the first transistor and the gate of the second transistor, and the second Miller device is operatively connected between the drain of the second transistor and the gate of the first transistor.

9. The VCO circuit of claim 8, wherein at least one of the first Miller device and the second Miller device is a Miller capacitor.

10. The VCO circuit of claim 1, wherein at least one of the first LC-tank module and the second LC-tank module comprises a plurality of serially-connected capacitors operatively connected in parallel to a plurality of serially-connected varactors.

11. A voltage controlled oscillator ("VCO") circuit, comprising:
   a switch module, wherein the switch module comprises a first transistor and a second transistor;
   a first LC-tank module with a first plurality of serially connected inductors;
   a second LC-tank module with a second plurality of serially connected inductors, wherein the first LC-tank module is connected between the drain of the first transistor and the drain of the second transistor, and the second LC-tank module is connected between the gate of the first transistor and the gate of the second transistor; and
   a first Miller device and a second Miller device, wherein the first Miller device is connected between the drain of the first transistor and the gate of the second transistor, and the second Miller device is connected between the drain of the second transistor and the gate of the first transistor;
   wherein the source of the first transistor and the source of the second transistor are operatively connected,
   wherein at least one of the first LC-tank module and the second LC-tank module comprises a plurality of serially and directly connected capacitors that are operatively connected in parallel to a plurality of serially and directly connected varactors and are operatively connected in parallel to at least one of the first plurality of serially connected inductors and the second plurality of serially connected inductors.

12. The VCO circuit in claim 11, wherein at least one of the first Miller device and the second Miller device is a Miller capacitor.

13. The VCO circuit in claim 11, wherein the first plurality of inductors and the second plurality of inductors are coupled to form a transformer.

14. The VCO circuit in claim 11, wherein the transformer is connected between the gates and the drains of the first transistor and the second transistor to provide feedback between the gates and the drains of the first transistor and the second transistor.

15. The VCO circuit in claim 11, wherein at least one of the first transistor and the second transistor is an NMOS transistor.

16. The VCO circuit in claim 11, wherein the source of the first transistor and the source of the second transistor are connected to a current source.

17. A voltage controlled oscillator ("VCO") circuit, comprising;
   a first LC-tank module, wherein the first LC-tank module comprises a first plurality of capacitors, a first plurality of varactors and a first plurality of inductors;
   a second LC-tank module, wherein the second LC-tank module comprises a second plurality of capacitors, a second plurality of varactors and a second plurality of inductors;
   a switch module, wherein the switch module comprises a plurality of transistors, and wherein the switch module is operatively connected to the first LC-tank module and the second Le-tank module; and
   two Miller devices, wherein each of the two Miller devices is operatively connected to the first LC-tank module, the second LC-tank module, and the switch module,
   wherein the first plurality of inductors is coupled to the second plurality of inductors to form a transformer.

18. The VCO circuit of claim 17, wherein at least one of the plurality of transistors is an NMOS transistor.

19. The VCO circuit of claim 17, wherein at least one of the plurality of Miller devices is a Miller capacitor.

20. The VCO circuit of claim 17, wherein the sources the plurality of transistors in the switch module is operatively connected to the drain of a tail transistor, and the source of the tail transistor is grounded.

* * * * *